(12) United States Patent
Patlolla et al.

(10) Patent No.: US 10,903,161 B2
(45) Date of Patent: Jan. 26, 2021

(54) BACK END OF LINE METALLIZATION STRUCTURE

(71) Applicant: INTERNATIONAL BUSINESS MACHINES CORPORATION, Armonk, NY (US)

(72) Inventors: Raghuveer R. Patlolla, Guilderland, NY (US); James J. Kelly, Schenectady, NY (US); Cornelius Brown Peethala, Slingerlands, NY (US); Chih-Chao Yang, Glenmont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/682,142

(22) Filed: Nov. 13, 2019

(65) Prior Publication Data

US 2020/0144180 A1 May 7, 2020

Related U.S. Application Data

(62) Division of application No. 16/178,781, filed on Nov. 2, 2018.

(51) Int. Cl.
| | |
|---|---|
| *H01L 23/522* | (2006.01) |
| *H01L 23/528* | (2006.01) |
| *H01L 23/532* | (2006.01) |
| *H01L 27/22* | (2006.01) |

(Continued)

(52) U.S. Cl.
CPC ........ *H01L 23/5226* (2013.01); *H01L 23/528* (2013.01); *H01L 23/5329* (2013.01); *H01L 23/53209* (2013.01); *H01L 23/53214* (2013.01); *H01L 23/53228* (2013.01); *H01L 23/53233* (2013.01); *H01L 23/53242* (2013.01); *H01L 23/53257* (2013.01); *C22C 9/00* (2013.01); *H01L 27/222* (2013.01); *H01L 43/02* (2013.01)

(58) Field of Classification Search
CPC ......... H01L 2924/0002; H01L 2924/00; H01L 23/53238; H01L 23/5226; H01L 23/53295; H01L 23/528; H01L 21/76843; H01L 23/5329
USPC .......................... 257/751, 774; 438/637, 618
See application file for complete search history.

(56) References Cited

U.S. PATENT DOCUMENTS

| | | | |
|---|---|---|---|
| 7,776,743 B2 | 8/2010 | Russell et al. | |
| 8,980,708 B2 | 3/2015 | Zhu et al. | |
| 9,130,022 B2 | 9/2015 | Wu et al. | |

(Continued)

OTHER PUBLICATIONS

Li, J. et al., "Oxidation and protection in copper and copper alloy thin films", J. Appl. Phys., vol. 70, No. 5, Sep. 1, 1991, pp. 2820-2827, American Institute of Physics.

(Continued)

*Primary Examiner* — Jonathan Han
(74) *Attorney, Agent, or Firm* — Cantor Colburn LLP; James Nock (57) ABSTRACT

Back end of line metallization structures and processes of fabricating the metallization structures generally include one or more metal filled via structures within a dielectric layer of an interconnect level, wherein at least one of the metal filled via structures includes a bulk metal and a metal alloy overlaying the bulk metal, wherein the bulk metal and metal alloy filled via is coupled to an active circuit.

20 Claims, 7 Drawing Sheets

(51) Int. Cl.
  *H01L 43/02* (2006.01)
  *C22C 9/00* (2006.01)

(56) References Cited

U.S. PATENT DOCUMENTS

| | | |
|---|---|---|
| 9,349,689 B2 | 5/2016 | Yang et al. |
| 9,673,089 B2 | 6/2017 | Bonilla et al. |
| 9,911,698 B1 | 3/2018 | Yang |
| 2007/0037394 A1 | 2/2007 | Su et al. |
| 2007/0096319 A1* | 5/2007 | Hsu ............ H01L 21/7682 257/750 |
| 2008/0111239 A1* | 5/2008 | Yang ............ H01L 21/76847 257/751 |
| 2010/0248473 A1 | 9/2010 | Ishizaka et al. |
| 2016/0064648 A1 | 3/2016 | Tsubata et al. |
| 2016/0181386 A1* | 6/2016 | Chi ............ H01L 21/76805 257/288 |
| 2017/0025381 A1* | 1/2017 | Tsai ............ H01L 25/50 |
| 2017/0053967 A1 | 2/2017 | Chuang et al. |
| 2017/0352804 A1 | 12/2017 | Chuang et al. |
| 2018/0040814 A1 | 2/2018 | Park |

OTHER PUBLICATIONS

List of IBM Patents or Patent Applications Treated as Related; (Appendix P), Date Filed Nov. 13, 2019; 2 pages.

Raghuveer R. Patlolla et al."Back End of Line Metallization Structure", U.S. Appl. No. 16/178,781, filed Nov. 2, 2018.

* cited by examiner

BACK END OF LINE METALLIZATION STRUCTURE

DOMESTIC PRIORITY

This application is a divisional of U.S. application Ser. No. 16/178,781 entitled "BACK END OF LINE METALLIZATION STRUCTURE," filed Nov. 2, 2018, incorporated herein by reference in its entirety.

BACKGROUND

The present invention generally relates to semiconductor integrated circuits, and more particularly, to the structure and formation of back end of line metallization structures. Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact formation. Layers of interconnections are formed above these logical and functional layers during the BEOL processing to complete the integrated circuit structure. As such, BEOL processing generally involves the formation of insulators and conductive wiring.

SUMMARY

Embodiments of the present invention are generally directed to semiconductor structures including back end of line metallization structures. A non-limiting example of a back end of line metallization structure according to one or more aspects of the present invention includes one or more metal filled via structures within a dielectric layer of an interconnect level. At least one of the metal filled via structures includes a bulk metal and a metal alloy overlaying the bulk metal. The bulk metal and metal alloy filled via are coupled to an active circuit.

A non-limiting example of the semiconductor structure includes a back end of line metallization structure according to one or more aspects of the present invention includes a first interconnect level including a dielectric and one or more vias. A second interconnect level is provided on the first interconnect level including one or more floating line features and one or more active line features. A third interconnect level is provided on the second interconnect level including one or more vias, wherein at least one of the one or more vias is coupled to the active line feature and includes a bulk metal and a metal alloy on the bulk metal.

A non-limiting example of a back end of the line process for forming an interconnect structure according to one or more aspects of the present invention includes depositing a dielectric layer onto an underlying interconnect level, wherein the dielectric layer includes SiC, SiN or SiC (N,H), and wherein the underlying interconnect level includes floating conductive features and active conductive features. The dielectric layer is lithographically patterned and etched to form one or more via openings, wherein the openings expose a top surface of at least one of the floating conductive features and the active conductive features. A metal is deposited into the one or more openings. The surface is planarized to remove an excess of the metal such that the uppermost surfaces of the metal filled vias coupled to the floating conductive features and the dielectric layer are coplanar to each other, and recesses are formed in the metal filled vias coupled to the active conductive features. The recesses are filled with a metal alloy such that the uppermost surfaces of the metal filled vias coupled to the active conductive features and the dielectric layer are coplanar to each other.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention generally relates to back end of line (BEOL) metallization structures and processes for forming the metallization structures. The structures and processes generally include providing a copper alloy limited to recesses provided in recessed copper via structures that are coupled to an active interconnect structure. As used herein, the term "active" refers to via structures that are coupled to an underlying interconnect structure, e.g., a line, that further includes an additional underlying interconnect structure connection, e.g., a via, having at least a portion coaxially aligned with the recessed via structure. In contrast, the term "floating" generally refers to the absence of the additional underlying interconnect structure. By way of example, the recessed copper via structure can be at a via 1 interconnect level and the underlying metallization structure a metal 1 interconnect level. Underlying the metal 1 interconnect level and coaxial to the recessed copper via structure is a via 0 level.

It has been discovered that planarization processes to remove the metal overburden after deposition of a third interconnect structure, e.g., via, is subject to greater erosion than floating interconnect structures, wherein the second interconnect structure is not coaxially coupled to an underlying first interconnect structure. Deposition of a copper alloy in the recess eliminates further erosion issue in downstream processing to form additional interconnect structures so as to complete the fabrication process. Additionally, providing the copper alloy in the recess provides a planar top surface, which can be desirable when fabricating pillar structures thereon that includes multiple metal layers and insulating layers or metal oxide layers depending on the device being fabricated.

Detailed embodiments of the integrated circuit including at least one copper via structure coaxially coupled to an underlying active interconnect structure and methods for fabricating the multiple levels of interconnect structures according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOS s, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

FIGS. 1-11 schematically illustrate cross sectional views of a BEOL metallization structure and process flow for forming the back end of line metallization structure for an integrated circuit in accordance with one or more aspects of the present invention.

Figure 1:
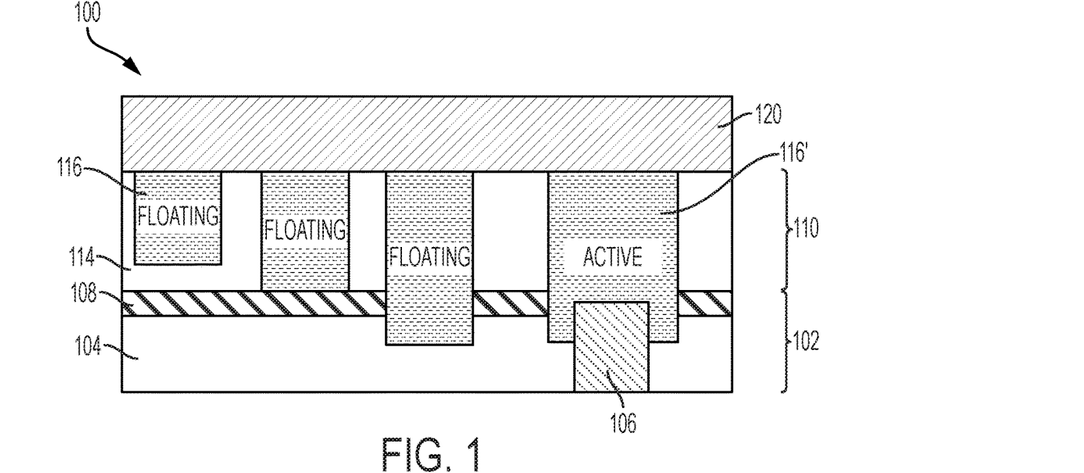
FIG. 1 depicts a cross section of an integrated circuit including a first and second metallization structures and a dielectric layer formed on the second metallization structure in accordance with one or more embodiments of the present invention.

In FIG. 1, there is shown a portion of an integrated circuit 100 including a metallization structure 102, e.g., a first interconnect structure. The first interconnect structure 102 includes a patterned dielectric layer 104 including one or more via openings that are filled with a metal to form a filled via 106. Although reference is made to a via opening, the structure could be a trench opening to form a line. A capping layer 108 is overlays the filled via 106 and dielectric layer 104.

The dielectric 104 of the first metallization structure 102 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer 104 can be deposited by PECVD procedures as is generally known in the art. Typically, the dielectric layer is silicon dioxide.

The metal filled via 106 can be any suitable conductor including, but not limited to Cu, Co, Al, AlCu, Ti, TiN, Ta, TaN, W, WN, Mo, MoN, Pt, Pd, Os, Ru, Jr, $IrO_2$, Re, $ReO_2$, $ReO_3$, Rh, alloys thereof, and mixtures thereof. The metal layer can be formed by CVD, sputtering, electrochemical deposition or like processes. For example, the deposition of copper can proceed by electrochemical deposition such as electroplating or electroless plating.

The capping layer 108 in accordance with one or more aspects of the present invention is an insulating material formed of a silicon nitride, silicon carbide, and/or a silicon carbide (N, H).

The first metallization structure 102 is a conventional metallization structure, wherein the dielectric 104 is lithographically patterned and etched to form one or more openings that will define the metal interconnect. A liner layer (i.e., diffusion barrier layer) (not shown) can be conformally deposited onto the patterned dielectric layer 104 prior to filling the via with a metal. A typical liner layer can include tantalum, tantalum nitride, cobalt, ruthenium, titanium, titanium nitride, tungsten nitride, or combinations of more than one material (for example tantalum nitride/tantalum or tantalum nitride/cobalt). The presence of the liner layer such as titanium nitride, for example, insures that a metal such copper, which can participate in interdiffusion during subsequent annealing processes, to fabricate the integrated circuit 100 will not further diffuse into interlayer dielectric. The liner layer can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of metal is then deposited, which will be used to define the metal filled via 106. The metal can be copper, but can be any suitable conductor including, but not limited to Cu, Co, Al, AlCu, Ti, TiN, Ta, TaN, W, WN, Mo, MoN, Pt, Pd, Os, Ru, Jr, $IrO_2$, Re, $ReO_2$, $ReO_3$, Rh, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 atomic weight percent (wt. %) to about 10 atomic wt %).

The metal layer can be formed by CVD, sputtering, electrochemical deposition or like processes. For example, the deposition of copper can proceed by electrochemical deposition such as electroplating or electroless plating.

Following formation of the metal layer, the substrate is typically subjected to a planarization process to remove any metal overburden (includes seed layer and liner layer removal) such that a top surface of the metal filled via 106 is substantially coplanar to the dielectric layer 104 as shown. By way of example, the surface can be planarized using an electropolishing process. In an electropolishing process, small amounts of metal are etched by electroetch or electrochemical etching to provide a metal interconnect having a top metal surface generally coplanar to the top surface of the dielectric. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process A second metallization structure 110, i.e., second interconnect structure, is formed on the first metallization layer 102. The second metallization structure 110 includes a patterned dielectric layer 114 including one or more trench openings filled with a metal to form metal filled line features 116, 116'. Formation of the one or more trench openings can include lithographically patterning the cap layer 108. At least one of the line features 116' in the sectional view is coupled to the underlying metal filled via 106, which can be referred to as an active metallization feature The other line features 116 are depicted as floating features, i.e., not directly coupled to the underlying via 106.

The second metallization structure 110 can be fabricated in a manner similar to the first metallization structure. The top surface of the second metallization structure can be made to be substantially planar by a planarization process such as CMP.

A dielectric layer 120 is deposited onto the second metallization layer. The dielectric layer 120 is formed of a silicon nitride (SiN), silicon carbide (SiC), or a nitrogen doped silicon carbide (SiC (N, H)).

Figure 2:
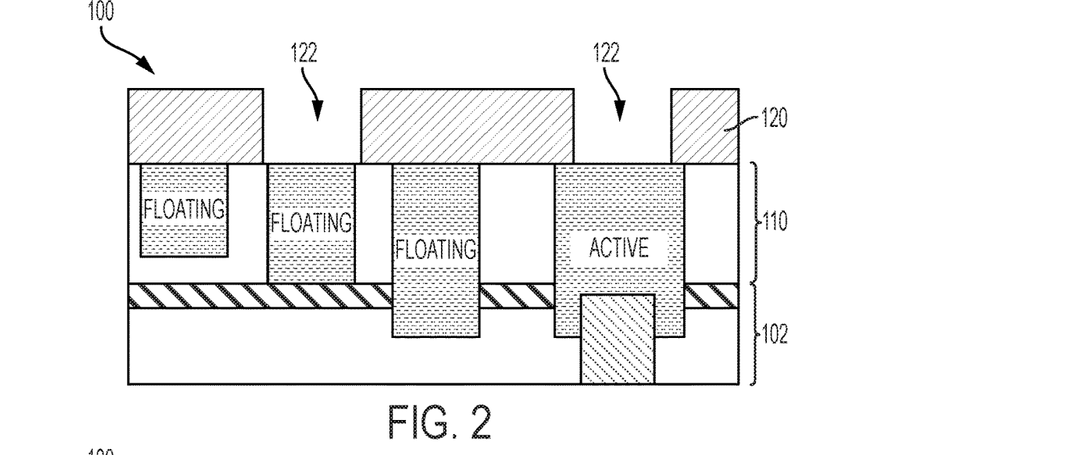
FIG. 2 depicts a cross section of integrated circuit FIG. 1 subsequent to patterning the dielectric layer to form one or more openings therein in accordance with one or more embodiments of the present invention.

As shown in FIG. 2, the dielectric layer 120 is lithographically patterned and etched to form one or more openings 122. Etching can be effected using a direction etch such as reactive ion etching. One of the openings exposes line feature 116', which in the sectional view is coupled to a via in the first metallization structure 102.

Figure 3:
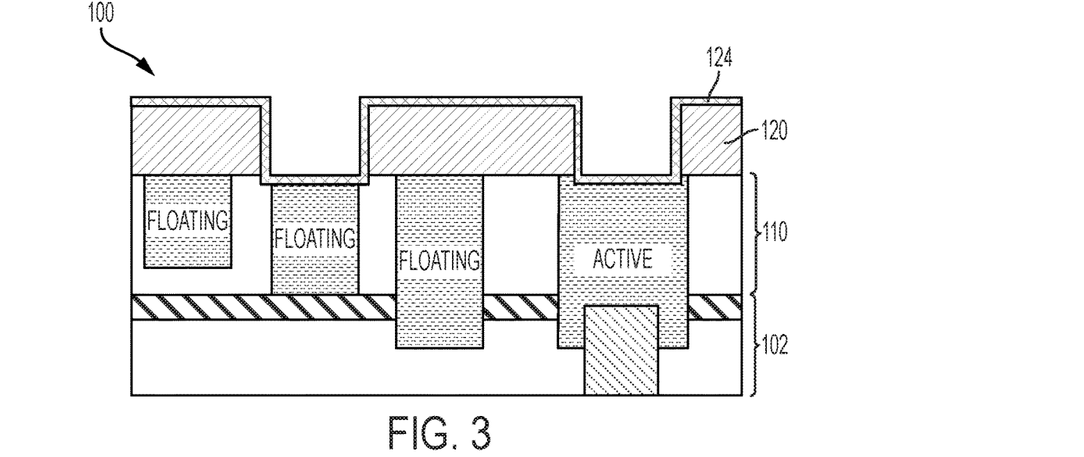
FIG. 3 depicts a cross section of the structure of FIG. 2 subsequent to a conformal deposition of a liner layer in accordance with one or more embodiments of the present invention.

FIG. 3 depicts the structure of FIG. 2 subsequent to conformal deposition of a liner layer 124. A typical liner layer can include tantalum, tantalum nitride, cobalt, ruthenium, titanium, titanium nitride, tungsten nitride, or combinations of more than one material (for example tantalum nitride/tantalum or tantalum nitride/cobalt). The presence of the liner layer such as titanium nitride, for example, insures that a metal such copper, which can participate in interdiffusion during subsequent annealing processes, to fabricate the integrated circuit 100 will not further diffuse into dielectric layer 120. The liner layer can be deposited by PVD, CVD, or ALD processes.

Next, as previously discussed, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Figure 4:
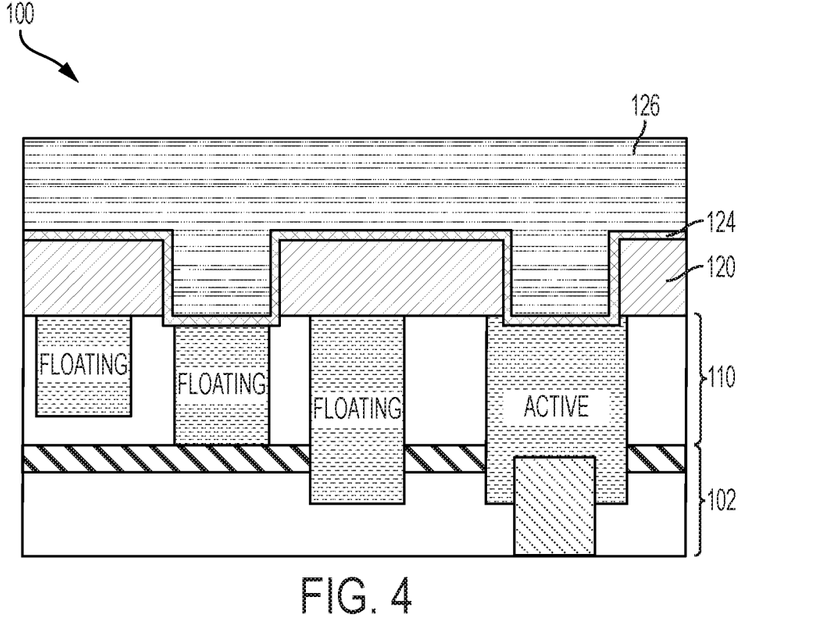
FIG. 4 depicts a cross section of the structure of FIG. 3 subsequent to deposition of a bulk metal in accordance with one or more embodiments of the present invention.

Following deposition of the seed layer, a layer of metal 126 is then deposited, which will be used to define the metal conductor as shown in FIG. 4. The metal can be copper, but can be any suitable conductor including, but not limited to Cu, Co, Al, AlCu, Ti, TiN, Ta, TaN, W, WN, Mo, MoN, Pt, Pd, Os, Ru, Jr, $IrO_2$, Re, $ReO_2$, $ReO_3$, Rh, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 atomic weight percent (wt. %) to atomic about 10 wt %.

The metal layer 126 can be formed by CVD, sputtering, electrochemical deposition or like processes. For example, the deposition of copper can proceed by electrochemical deposition such as electroplating or electroless plating.

Figure 5:
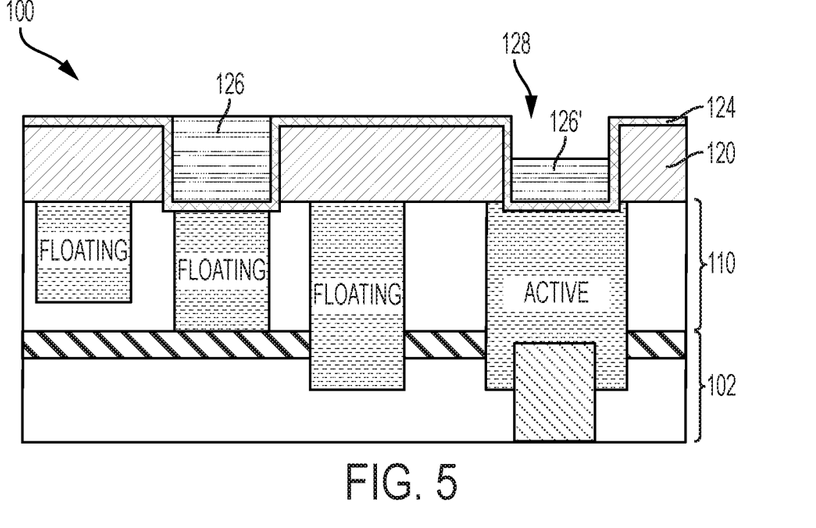
FIG. 5 depicts a cross section of the structure of FIG. 4 subsequent to planarization of the bulk metal layer to the liner layer in accordance with one or more embodiments of the present invention.

Referring now to FIG. 5, following formation of the metal layer 126, the substrate is subjected to a planarization process to remove any metal overburden stopping at the liner layer 124. For example, the surface can be planarized using an electropolishing process. In an electropolishing process, small amounts of metal are etched by electroetch or electrochemical etching to provide a metal interconnect having a top metal surface generally coplanar to the top surface of the dielectric. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process The planarization process results in a recess 128 formed in via feature 126', which in the sectional view is coupled to an "active" underlying line feature 116' in the second metallization structure 110. The planarization process does not result in a recess in vias overlying floating line features 116 as shown.

Figure 6:
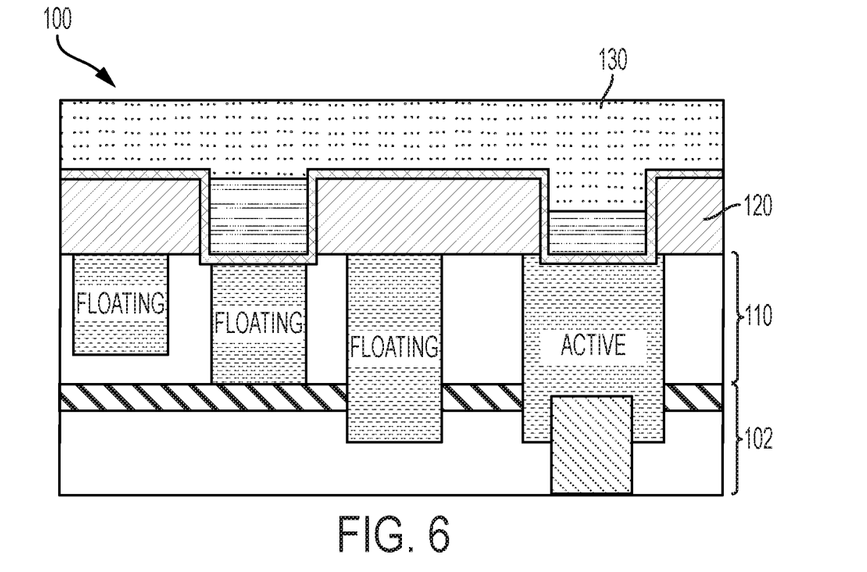
FIG. 6 depicts a cross section of the structure of FIG. 5 subsequent to deposition of a copper alloy layer in accordance with one or more embodiments of the present invention.

As shown in FIG. 6, a copper alloy 130 is deposited onto the structure of FIG. 5, filling the recess and providing an overburden of the copper alloy 130 on the surface of the structure 100.

The copper alloy includes an alloying element in an amount from 0.2 atomic weight percent to 30 atomic weight percent. In one or more embodiments, the alloying element is present in the copper alloy amount from 1 atomic weight percent to 25 atomic weight percent, and in still one or more embodiments, the alloying element is present in the copper alloy amount from 5 atomic weight percent to 20 atomic weight percent. The particular alloying element can include magnesium, aluminum, titanium, zirconium, cobalt, nickel, rhodium, ruthenium, mixtures thereof, mixtures including at least one of the foregoing, and the like.

Figure 7:
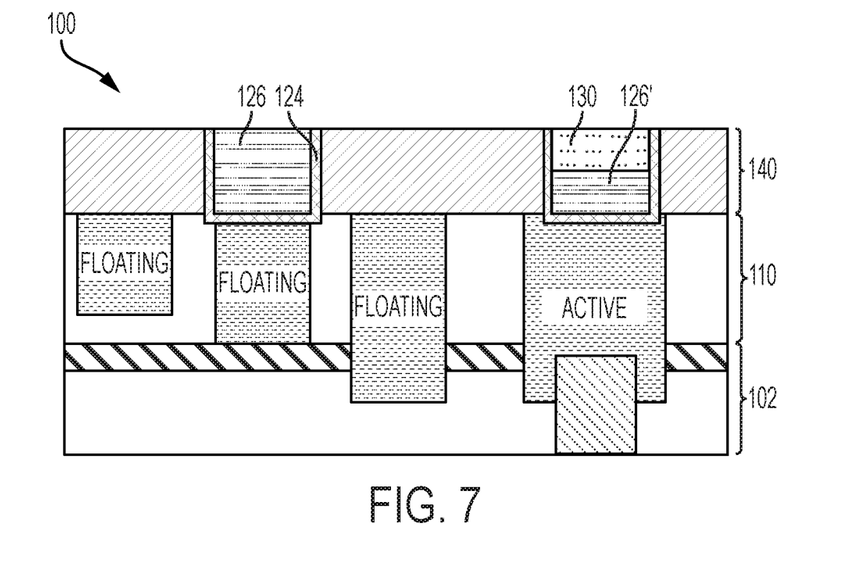
FIG. 7 depicts a cross section of the structure of FIG. 6 subsequent to planarization of the copper alloy layer in accordance in accordance with one or more embodiments of the present invention.

As shown in FIG. 7, following formation of the copper alloy 130, the substrate is again subjected to a planarization process as previously described to remove any copper alloy overburden including liner layer 124 such that a top surface of the metal conductors 126 and 126' are substantially coplanar to the dielectric layer 120 as shown. The resulting third metallization structure 140 overlying and coupled to the second metallization structure 102 includes a dielectric layer formed of SiC, SiN, and SiC (N, H), which functions as a barrier layer.

Figure 8:
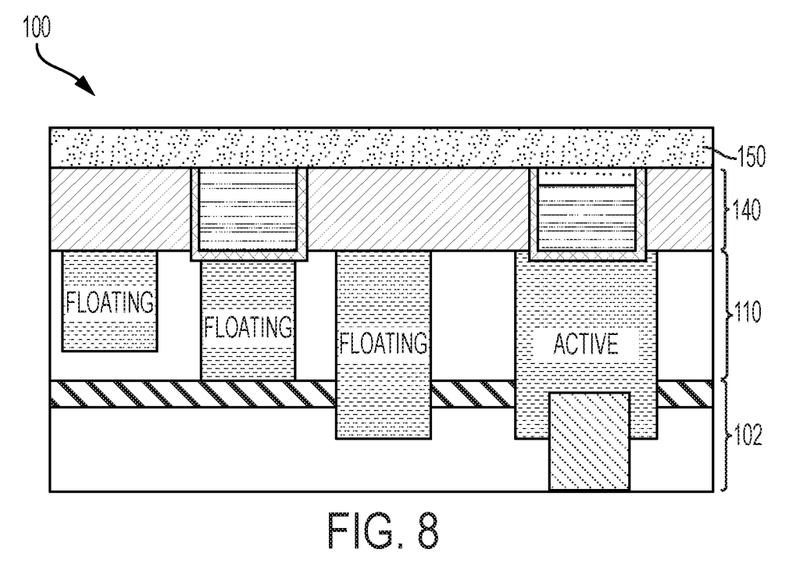
FIG. 8 depicts a cross section of the structure of FIG. 7 subsequent to deposition of a barrier layer in accordance with one or more embodiments of the present invention.

As shown in FIG. 8, a diffusion barrier layer 150 is deposited onto the third metallization structure 140. As will be described in greater detail below, the diffusion barrier layer 150 can be selected to be a conductive metallic material or an insulating material. Suitable conductive metallic materials include tantalum, titanium, tungsten, iridium, rhodium, ruthenium, cobalt, nickel, alloys thereof, nitrides thereof, or mixtures thereof. Suitable insulating materials include, SiN, SiC, SiO, or SiC(N, H).

Figure 9:
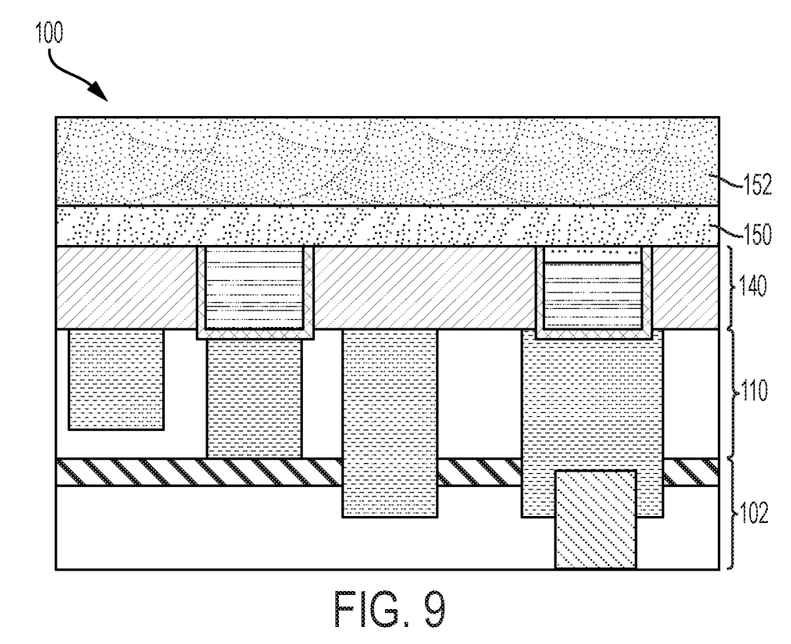
FIG. 9 depicts a cross section of the structure of FIG. 8 subsequent to deposition of a dielectric layer in accordance with one or more embodiments of the present invention.

In one or more embodiments as shown in FIG. 9, a dielectric layer 152 is deposited onto the diffusion barrier layer 150.

Figure 10:
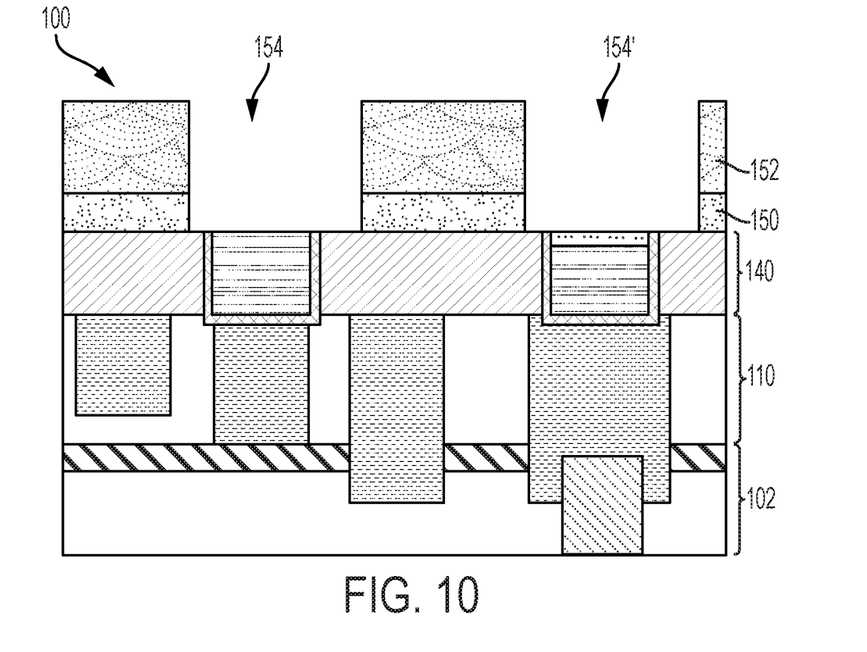
FIG. 10 depicts a cross section of the structure of FIG. 9 subsequent to patterning the dielectric layer and the barrier layer in accordance with one or more embodiments of the present invention.

In FIG. 10, the dielectric layer 152 and the barrier layer 150 are lithographically patterned to form openings 154, 154'. Opening 154' exposes at least a portion of the copper alloy of the active metal via structures. In this particular embodiment, the barrier layer 150 is selected to be an insulating material.

In FIG. 10, the openings 154 and 154' are filled with a metal 156 followed by planarization. The metal can be used to form an interconnect or in one or more embodiments include a multilayer metal structure including alternating layers of a metal oxide or insulator such as can be desired for forming magnetic tunneling junctions or memory stacks.

Figure 11:
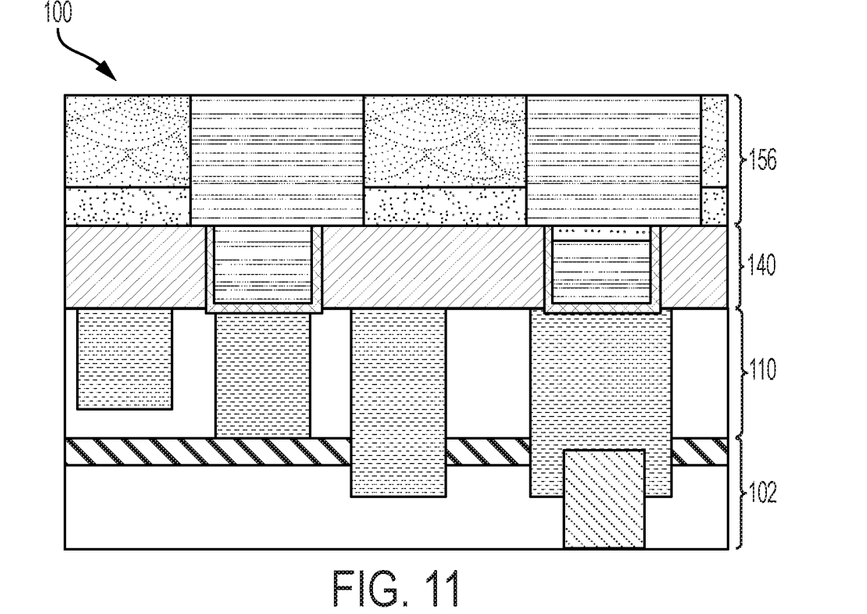
FIG. 11 depicts a cross section of the structure of FIG. 8 subsequent to in deposition of a bulk metal layer in accordance in accordance with one or more embodiments of the present invention.

In FIG. 11, a metal layer is deposited onto the structure 100 and planarized to form metallization structure 156.

Figure 12:
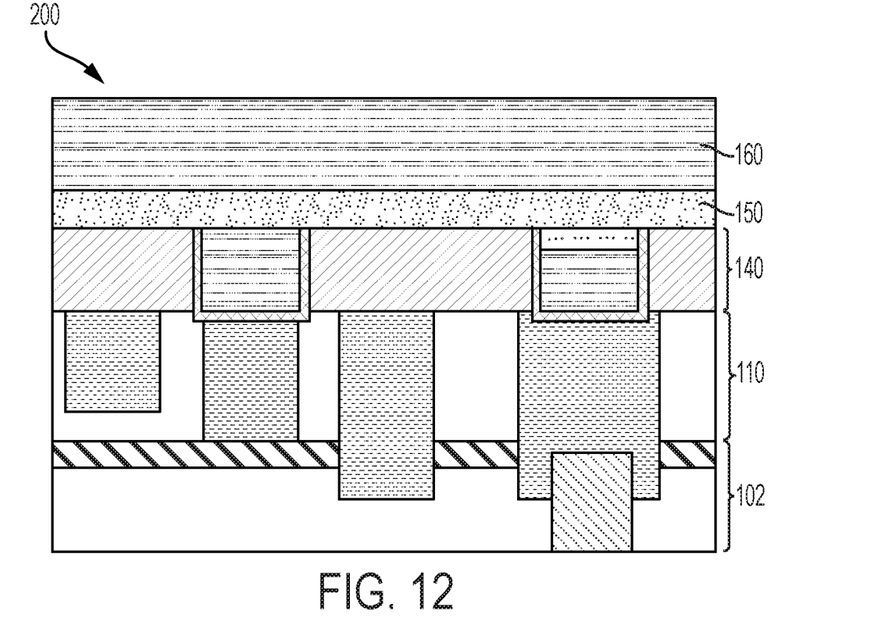
FIG. 12 depicts a cross section of the structure of FIG. 11 subsequent to patterning the bulk metal layer and barrier layer in accordance with one or more embodiments of the present invention.
Figure 13:
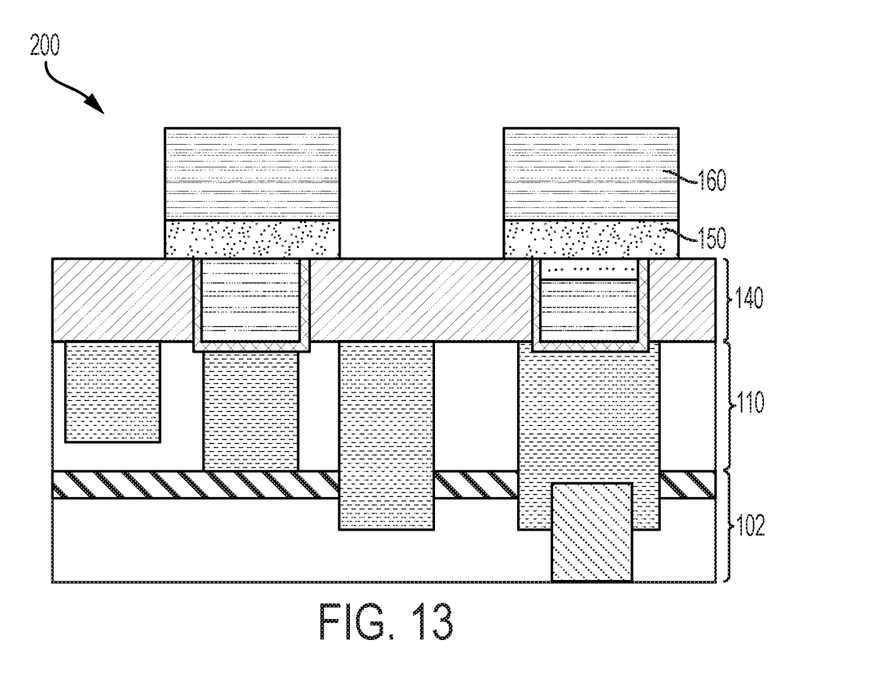
FIG. 13 depicts a cross section of the structure of FIG. 12 subsequent to deposition of a dielectric layer in accordance with one or more embodiments of the present invention.
Figure 14:
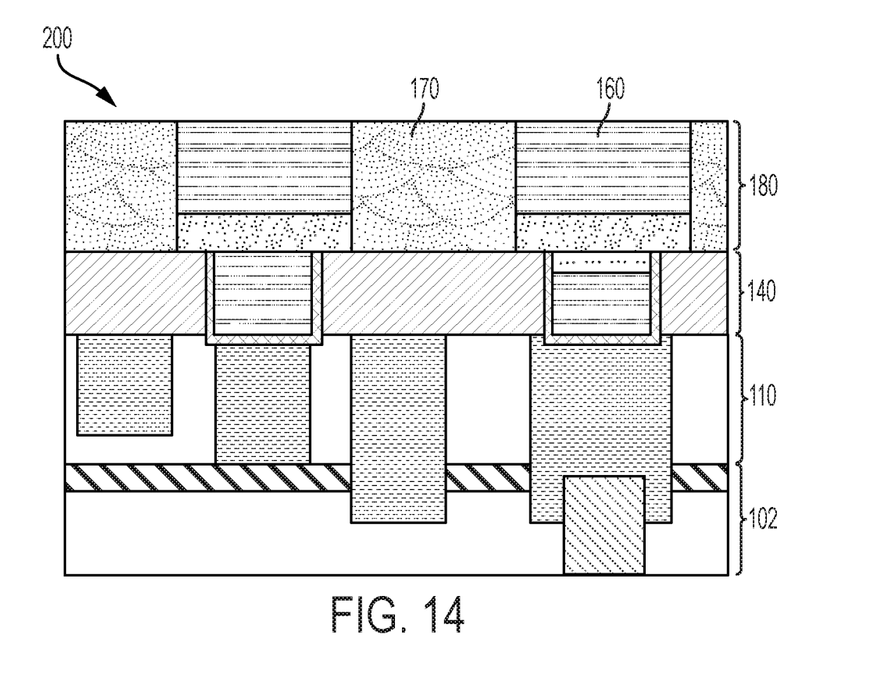
FIG. 14 depicts a cross section of the structure of FIG. 13 subsequent to in accordance in accordance with one or more embodiments of the present invention.

In one or more embodiments as shown in FIGS. 12-14, structure 200 includes a barrier layer 150 is selected to be a conductive metal instead of a dielectric material. A metal layer 160 is deposited onto the conductive metal layer 150 as shown in FIG. 12.

In FIG. 13, the metal layer 160 and underlying barrier layer 150 are lithographically patterned and etched to the underlying dielectric layer 120.

In FIG. 14, a dielectric layer 170 is then deposited followed by planarization to the patterned metal layer 160. As previously noted, the metal layer 160 can be an interconnect or a pillar structure such as a magnetic tunneling junction structure or a memory structure.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A back end of the line process for forming an interconnect structure, the process comprising:
   depositing a dielectric layer onto an underlying interconnect level, wherein the dielectric layer comprises SiC, SiN or SiC (N,H), and wherein the underlying interconnect level comprises floating conductive features and active conductive features;
   lithographically patterning and etching the dielectric layer to form one or more via openings, wherein the openings expose a top surface of at least one of the floating conductive features and the active conductive features;
   depositing an overburden of metal;
   planarizing a surface to remove an excess of the metal such that the uppermost surfaces of the metal filled vias coupled to the floating conductive features and the dielectric layer are coplanar to each other, and recesses are formed in the metal filled vias coupled to the active conductive features; and
   filling the recesses with a metal alloy such that the uppermost surfaces of the metal filled vias coupled to the active conductive features and the dielectric layer are coplanar to each other, the metal discontinuing at a bottom surface of the metal alloy.

2. The back end of the line process for forming an interconnect structure of claim 1, wherein the metal comprises copper and the metal alloy comprises copper and an alloying element.

3. The back end of the line process for forming an interconnect structure of claim 2, wherein the alloying element comprising magnesium, aluminum, titanium, zirconium, cobalt, nickel, rhodium, ruthenium, iridium, tantalum, or mixtures thereof.

4. The back end of the line process for forming an interconnect structure of claim 2, wherein the alloying element is in an amount from about 0.2 atomic weight percent (wt. %) to about 30 atomic wt %.

5. The back end of the line process for forming an interconnect structure of claim 1, wherein depositing the overburden of the metal comprises first conformally depositing a liner layer.

6. The back end of the line process for forming an interconnect structure of claim 5, wherein the liner layer comprises tantalum, tantalum nitride, cobalt, ruthenium, titanium, titanium nitride, tungsten nitride, or combinations thereof.

7. The back end of the line process for forming an interconnect structure of claim 1, wherein planarizing the surface comprises an electropolishing process.

8. The back end of the line process for forming an interconnect structure of claim 1, wherein planarizing the surface comprises chemical mechanical polishing process.

9. The back end of the line process for forming an interconnect structure of claim 1, wherein planarizing the surface comprises a non-selective plasma etching process.

10. The back end of the line process for forming an interconnect structure of claim 1, wherein the alloying element is in an amount from about 1 atomic weight percent (wt. %) to about 25 atomic wt %.

11. The back end of the line process for forming an interconnect structure of claim 1, wherein the alloying element is in an amount from about 5 atomic weight percent (wt. %) to about 20 atomic wt %.

12. The back end of the line process for forming an interconnect structure of claim 1, wherein subsequent to filling the recesses with the metal alloy the process further comprises a planarization process.

13. The back end of the line process for forming an interconnect structure of claim 1, further comprising depositing a diffusion barrier layer.

14. The back end of the line process for forming an interconnect structure of claim 13, wherein the diffusion barrier layer comprises a conductive metal or an insulating material.

15. The back end of the line process for forming an interconnect structure of claim 13, further comprising depositing an additional dielectric layer onto the diffusion barrier layer.

16. The back end of the line process for forming an interconnect structure of claim 15, further comprising lithographically patterning the additional dielectric layer and the diffusion barrier layer to form openings therein so as to expose at least a portion of the metal alloy in the underlying active metal via structure.

17. The back end of the line process for forming an interconnect structure of claim 16, further comprising depositing an additional metal in the openings provided by lithographically patterning the additional dielectric layer and the diffusion barrier layer.

18. The back end of the line process for forming an interconnect structure of claim 16, further comprising depositing a multilayer metal structure in the openings provided by lithographically patterning the additional dielectric layer and the diffusion barrier layer.

19. A back end of the line process for forming an interconnect structure, the process comprising:
providing an underlying interconnect level comprises floating conductive features and active conductive features;
depositing a dielectric layer onto the underlying interconnect level;
lithographically patterning and etching the dielectric layer to form one or more via openings exposing a top surface of at least one of the active conductive features;
filling the one or more via openings with a first metal to form metal filled vias and forming an overburden of the first metal thereon;
planarizing to remove the overburden of the first metal and form a recess in the metal filled vias that exposed the top surfaces of the active conductive features; and
filling the recesses with a second metal comprising a metal alloy, the first metal discontinuing at a bottom surface of the metal alloy.

20. A back end of the line process for forming an interconnect structure, the process comprising:
forming a first interconnect layer comprising one or more floating conductive features and one or more active conductive features; and
forming a second interconnect layer on the first interconnect layer, the second interconnect layer comprising at least one metal filled via coaxially aligned with and in contact with at least one of the one or more active conductive features, wherein the at least one metal filled via comprises a first metal and a second metal provided within a recess in the first metal, wherein the first metal is different from the second metal, the first metal discontinuing at a bottom surface of the second metal.

* * * * *